(12) United States Patent
Ananthanarayanan et al.

(10) Patent No.: US 6,570,409 B2
(45) Date of Patent: May 27, 2003

(54) CURRENT STEERING LOGIC CIRCUITS

(75) Inventors: Priya Ananthanarayanan, Sunnyvale, CA (US); Gajendra P. Singh, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/827,412

(22) Filed: Apr. 6, 2001

(65) Prior Publication Data

US 2002/0145451 A1 Oct. 10, 2002

(51) Int. Cl.[7] .................. H03K 19/20; H03K 19/096
(52) U.S. Cl. ........................... 326/115; 326/98
(58) Field of Search ................. 326/115, 112, 326/126–127, 98

(56) References Cited

U.S. PATENT DOCUMENTS 5,162,674 A * 11/1992 Allstot et al. ................ 326/115
5,656,954 A * 8/1997 Kondoh et al. ............. 326/115

FOREIGN PATENT DOCUMENTS

JP          59161920 A  *  9/1984  .................. 326/115

* cited by examiner

Primary Examiner—Michael Tokar
Assistant Examiner—James H Cho
(74) Attorney, Agent, or Firm—Rosenthal & Osha L.L.P.

(57) ABSTRACT

A method and apparatus for performing logic operations using a current mode logic circuit is provided. Further, a method and apparatus for performing high fan-in logic operations is provided. Further, a logic circuit that selectively steers current based upon a plurality of inputs is provided. Further, a method for performing logic operations using current steering is provided.

15 Claims, 4 Drawing Sheets

CURRENT STEERING LOGIC CIRCUITS

BACKGROUND OF INVENTION

Background Art

The design of a computer system may be broken down into three parts-system design, logic design, and circuit design. System design involves breaking the overall system into subsystems and specifying the characteristics of each subsystem. For example, system design of a computer system could involve specifying the number and type of memory units, arithmetic units, and input-output devices as well as the interconnection and control of these subsystems. Logic design involves determining how to interconnect basic logic building blocks to perform a specific function. An example of logic design is determining the interconnection of logic gates and flip-flops to perform binary addition. Circuit design involves specifying the interconnection of specific components such as resistors, diodes, and transistors to form a gate, flip-flop, or other logic building block.

A logic building block evaluates its input(s) and outputs a result based on the type of function that the logic building block performs. For example, an AND logic gate, a type of logic building block, outputs logic low whenever one of its inputs is logic low and outputs logic high when all of its inputs are logic high. Alternatively, an OR logic gate outputs logic high whenever one of its inputs is logic high and outputs logic low when all of its inputs are logic low. The number of inputs that a logic building block has is referred to as its "fan-in." In other words, fan-in refers to the number of devices that are driving another device.

An important aspect of circuit design is how logic building blocks, such as logic gates, are actually implemented in a computer system. A typical approach used to implement logic building blocks is through the use of complementary metal-oxide-semiconductor ("CMOS") logic families.

CMOS logic families use metal-oxide-semiconductor field-effect ("MOSFET") transistors. The use of MOSFET transistors is beneficial because almost no current is needed to operate the transistors. However, MOSFETs operate slower than devices used in other logic families. MOSFETs may be divided into two types of transistors: positive-channel metal-oxide semiconductor ("PMOS") transistors and negative-channel metal-oxide semiconductor ("NMOS") transistors. A transistor is 'on' when there is an electrical pathway across the transistor such that a voltage at one terminal of the transistor can be seen at another terminal of the transistor. NMOS transistors can be switched 'on' or 'off' by the movement of electrons, whereas PMOS transistors can be switched 'on' or 'off' by the movement of electron vacancies. A MOSFET has a voltage threshold ("$V_T$") value, which is the voltage level at which the MOSFET switches 'on' or 'off.' Generally, a NMOS transistor switches 'on' when there is a high voltage applied to the input of the NMOS transistor and a PMOS transistor switches 'on' when there is a low voltage, e.g., ground, applied to the input of the PMOS transistor.

Two types of logic gates are static logic gates and dynamic logic gates. Typically, static logic gates have a PMOS and a NMOS transistor for every input. Therefore, with higher fan-in, static logic gates require increased space since the number of transistors needed increases faster than the number of inputs.

Generally, both types of logic gates operate using voltage mode logic. Voltage mode logic is a type of implementation in which circuit behavior is based on a voltage source.

FIG. 1 shows a prior art embodiment of a static logic gate. Specifically, FIG. 1 shows an OR gate (11).

Inputs $IN_1$, $IN_2$, . . . , $IN_n$ serve as inputs to PMOS transistors $P_1$, $P_2$, . . . , $P_n$ (13, 15, 17) (also referred to as "PMOS input transistors"), respectively, where n represents the number of inputs to the OR gate (11). Inputs $IN_1$, $IN_2$, . . . , $IN_n$ also serves as inputs to NMOS transistors $N_1$, $N_2$, . . . , $N_n$ (19, 21, 23) (referred to as "NMOS input transistors"), respectively, where n represents the number of inputs to the OR gate (11).

The PMOS input transistors (13, 15, 17) are arranged in series with $P_1$ (13) having a terminal connected to high (25), i.e., a voltage source, and $P_n$ (17) having a terminal connected to a static node, STAT_NODE. The NMOS input transistors (19, 21, 23) are arranged in parallel with each NMOS input transistor (19, 21, 23) having a terminal connected to STAT_NODE and another terminal connected to low (27), i.e., ground. Further, wire resistances (5) are shown on STAT_NODE since a finite amount of voltage is dissipated on STAT_NODE due to these wire resistances (5).

STAT_NODE serves as an input to an inverter (29), which, in turn, outputs a logic voltage to an output, OUT, of the OR gate (11).

When all the inputs to the OR gate (11) are low, the PMOS input transistors (13, 15, 17) are all switched 'on,' and STAT_NODE gets connected to high (25) through the PMOS input transistors (13, 15, 17). In this case, the inverter (29) inputs high from STAT_NODE and outputs low to OUT.

When one or more of the inputs to the OR gate (11) are high, the corresponding NMOS input transistors switch 'on' and the corresponding PMOS input transistors switch 'off.' In this case, STAT_NODE gets connected to low (27) through the 'on' NMOS input transistors. Moreover, since one or more of the PMOS input transistors are 'off,' there is no connection between STAT_NODE and high (25). Thereafter, the inverter (29) inputs low from STAT_NODE and outputs high to OUT.

Dynamic logic gates are often used in place of static logic gates when speed, space, and flexibility are important. Typically, dynamic logic gates use a precharged node that replaces the transistors in series used in static logic gates. The dynamic implementation thus uses lesser space, and speed is increased since wait time for transistor switching is decreased.

Referring to FIG. 2, a prior art embodiment of a dynamic logic gate is shown. Specifically, FIG. 2 shows an OR gate (10).

The OR gate (10) includes a logic evaluation stage (12), which has inputs $IN_1$, $IN_2$, . . . , $IN_n$, which serve as inputs to transistors $N_1$, $N_2$, . . . , $N_n$ (14, 16, 18) (referred to as "input transistors"), where n represents the number of inputs to the OR gate (10). Each input transistor (14, 16, 18) has a terminal connected to dynamic node DYN_NODE, and another terminal connected to a terminal of an NMOS transistor (20) that resides outside the logic evaluation stage (12) (referred to as "outside NMOS transistor (20)").

The outside NMOS transistor (20), in addition to having a terminal connected to select terminals of the input transistors (14, 16, 18) inside the logic evaluation stage (12), has another terminal connected to low (22). Moreover, a clock signal, CLK, serves as an input to the outside NMOS transistor (20).

DYN_NODE is connected to a terminal of a first PMOS transistor (24), and DYN_NODE is also connected to a terminal of a second PMOS transistor (30). Additionally, DYN_NODE serves as an input to an inverter (28), which, in turn, outputs to both an input of the second PMOS transistor (30) and to the output, OUT, of the OR gate (10). Further, wire resistances (19) are shown on DYN_NODE since a finite amount of voltage is dissipated on DYN_NODE due to these wire resistances (19).

The first PMOS transistor (24), in addition to having a terminal connected to DYN_NODE, has a terminal connected to high (26). The second PMOS transistor (30), in addition to having a terminal connected to DYN_NODE, also has a terminal connected to high (26). Moreover, CLK serves as an input to the first PMOS transistor (24).

When CLK goes low, the first PMOS transistor (24) switches 'on,' and DYN_NODE gets connected to high (26) through the first PMOS transistor (24). The inverter (28), in turn, inputs high and outputs low to both the input of the second PMOS transistor (30) and OUT. Since the input to the second PMOS transistor (30) goes low, the second PMOS transistor (30) switches 'on,' causing DYN_NODE to also get connected to high (26) through the second PMOS transistor (30). It follows that when CLK goes high, although the first PMOS transistor (24) switches 'off,' DYN_NODE is still high since it remains connected to high (26) through the second PMOS transistor (30). Thus, DYN_NODE is said to be "precharged" high.

When one (or more) of the inputs to the OR gate (10) goes high, the input transistor corresponding to that input switches 'on,' and DYN_NODE gets connected to a terminal of the outside NMOS transistor (20). When CLK goes high, the outside NMOS transistor (20) switches 'on,' and DYN_NODE gets connected to low (22) through the outside NMOS transistor (20). At this point, although DYN_NODE is momentarily connected to both high (26) through the second PMOS transistor (30) and low (22) through the outside NMOS transistor (20), the outside NMOS transistor (20) out drives the second PMOS transistor (30) since the outside NMOS transistor (20) is sized such that it is stronger than the second PMOS transistor (30), and DYN_NODE goes low.

As DYN_NODE goes low, the inverter (28) outputs high at OUT. The inverter (28) also outputs high to the input of the second PMOS transistor (30), causing the second PMOS transistor (30) to switch 'off.'

However, at the next falling edge of CLK, the outside NMOS transistor (22) switches 'off,' the first PMOS transistor (24) switches 'on,' and DYN_NODE goes back high since it gets connected to high (26) through the first PMOS transistor (24), and ensuingly, through the second PMOS transistor (30) as described above.

In summary, the OR gate (10) has a dynamic node, DYN_NODE, that is precharged high. When DYN_NODE is high, the OR gate (10) outputs low during both high and low phases of a clock signal. However, whenever one or more inputs to the OR gate (10) go high, DYN_NODE is discharged and the OR gate (10) outputs high until the clock signal goes low.

When logic gates such as the one described above with reference to FIG. 2 have a large number of inputs or high fan-in, i.e., n is large, special considerations come into play. One such consideration is that the amount of current that passes through a transistor in an 'off' state (referred to as "leakage current") increases as a transistor becomes faster.

For example, in the case of the OR gate (10) described above in reference to FIG. 2, if the input transistors (14, 16, 18) have higher leakage currents, then the output to the OR gate (10) is susceptible to erroneous switching since DYN_NODE becomes prone to voltage dissipation through the outside NMOS transistor (20). In order to combat this phenomenon, the size of the second PMOS transistor (30) (referred to as "keeper transistor") is increased relative to the size of the outside NMOS transistor (20). With a high number of inputs, the size of the keeper transistor has to be increased even more to combat the total leakage current from all the input transistors. However, increasing the size of the keeper transistor results in a loss of speed, wherein the loss of speed is counteracted by skewing the inverter (28), i.e., designing the inverter (28) to favor a rising transition at its output. Skewing the inverter (28), in turn, leads to less noise immunity at OUT.

SUMMARY OF INVENTION

In one aspect, a current steering stage for a logic circuit having a logic evaluation stage connected to an evaluation node comprises a current source that sources current to the evaluation node, and a sink device connected to the evaluation node that selectively sinks current from the current source depending upon the logic evaluation stage.

In another aspect, a current steering logic circuit comprises a logic evaluation stage connected to an evaluation node and having a plurality of inputs, a current steering stage connected to the evaluation node, and a current sensor and translator stage connected to the evaluation node.

In another aspect, a method for steering current in a current mode logic circuit having a logic evaluation stage connected to an evaluation node comprises inputting a plurality of inputs, sourcing current to the evaluation node, and selectively steering current between the logic evaluation stage and a sink device depending upon the plurality of inputs.

In another aspect, a method for performing operations in a current mode logic circuit with high fan-in and having a logic evaluation stage comprises inputting a plurality of inputs, sourcing current to an evaluation node, wherein the evaluation node is connected to the logic evaluation stage, selectively steering sourced current from the current source to a sink device depending upon the plurality of inputs, sensing an amount of current flow through a sink device, and selectively translating the sensed amount of current flow through the sink device to an output voltage.

Other aspects and advantages of the invention will be apparent from the following description and the appended claims.

DETAILED DESCRIPTION

The present invention relates to a method and apparatus for performing high fan-in logic operations using a current steering logic circuit. The invention also relates to a method for performing faster high fan-in logic operations relative to methods not using the current steering logic circuit described in the present invention. The invention further relates to a method for performing high fan-in logic operations using dynamic logic. The invention also relates to an apparatus for a circuit that performs faster high fan-in logic operations relative to apparatuses not using current steering logic circuitry described in the present invention. The invention further relates to an apparatus for a circuit that performs high fan-in logic operations using dynamic logic circuitry.

The present invention employs a current steering stage that is used in logic circuits having normal or high fan-in. The current steering stage involves steering a current, generated by a current source, in response to the behavior of input devices within a logic evaluation stage.

Figure 1:
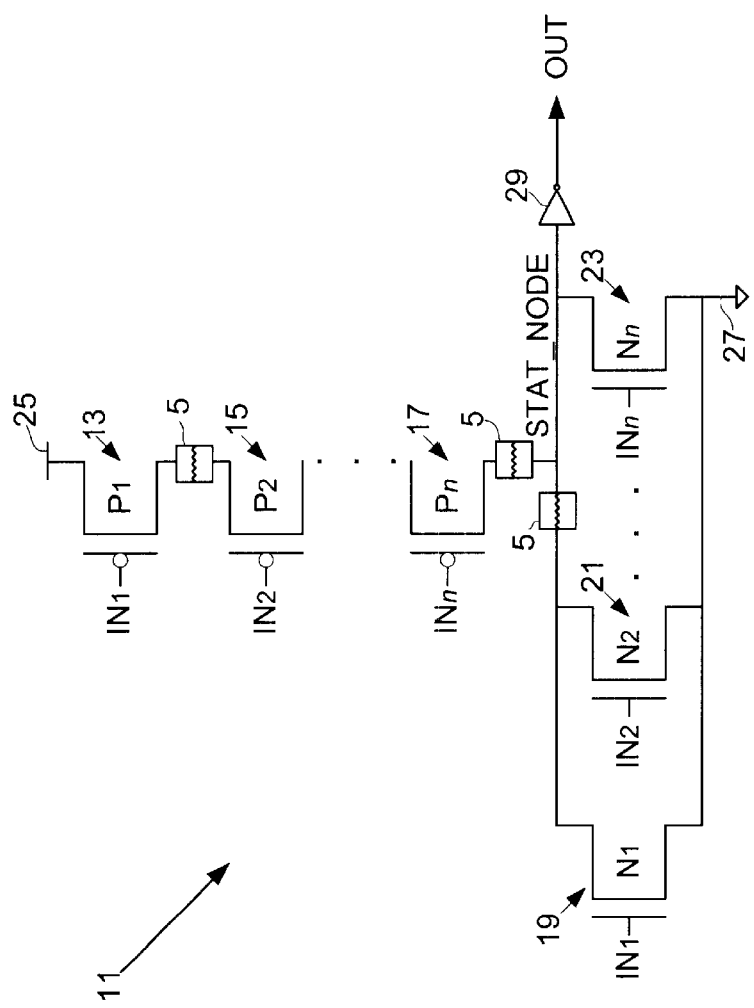
FIG. 1 shows a prior art embodiment of a static logic gate.
Figure 2:
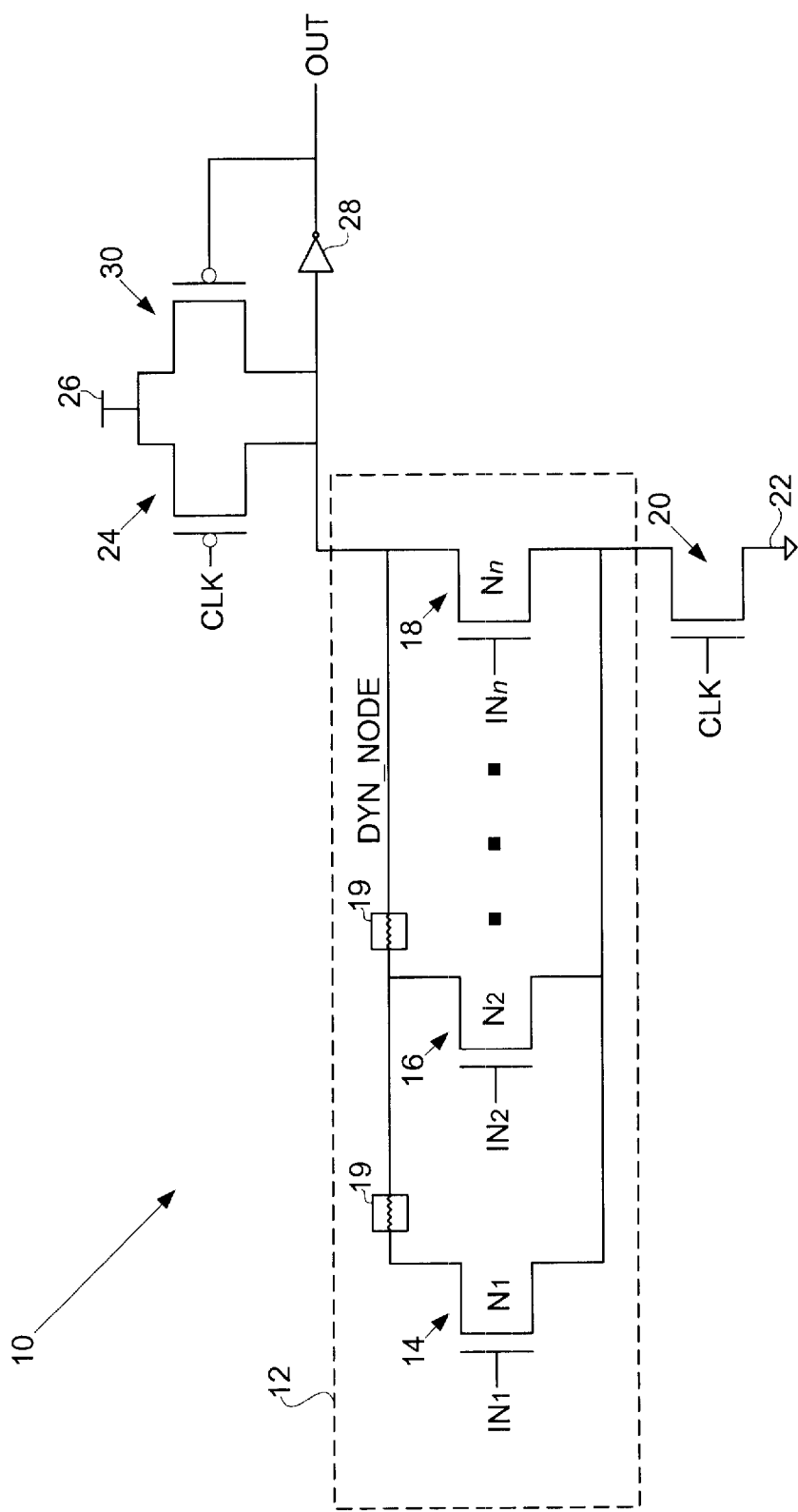
FIG. 2 shows a prior art embodiment of a dynamic logic gate.
Figure 3:
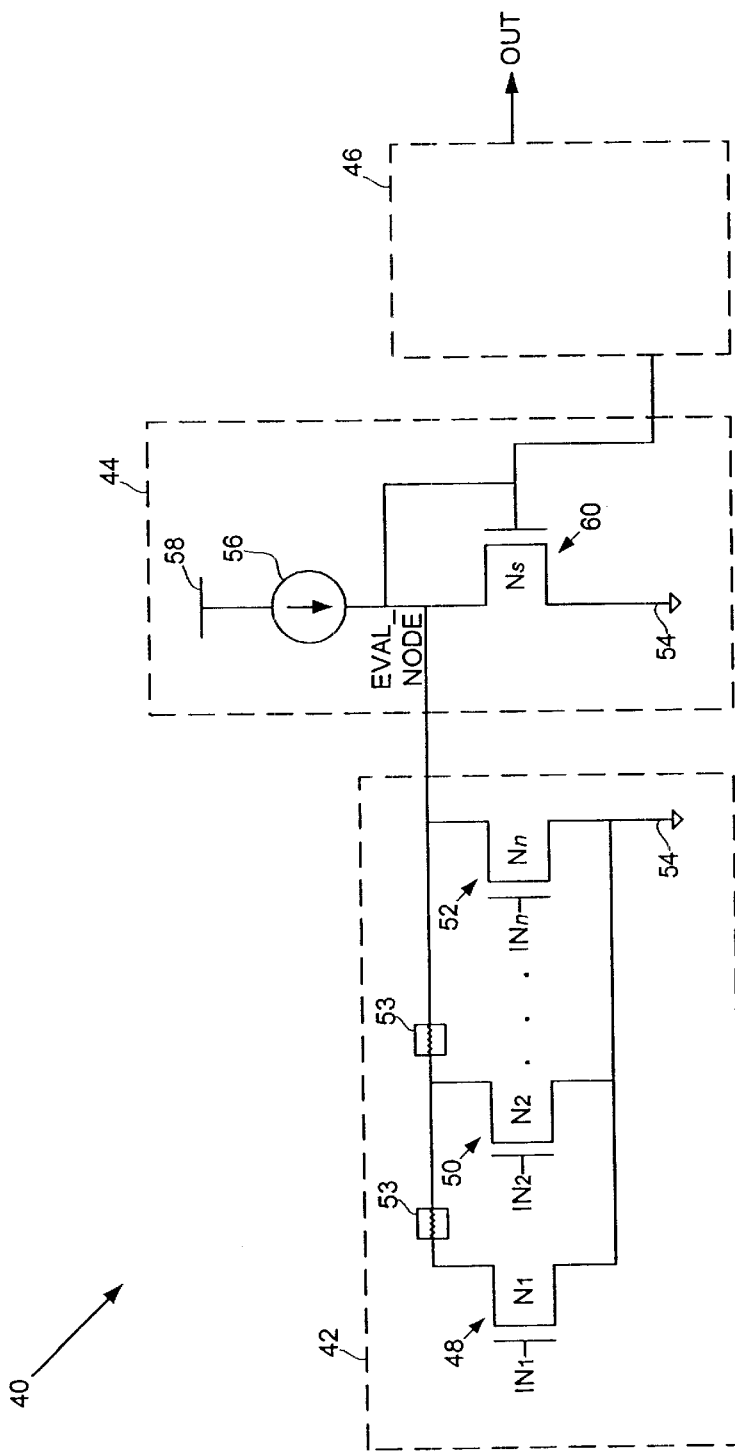
FIG. 3 shows a logic circuit in accordance with an embodiment of the present invention.

FIG. 3 shows an exemplary circuit using a current steering stage in accordance with an embodiment of the present invention. Particularly, FIG. 3 shows a current steering logic circuit (40) that performs logic OR operations. The current steering logic circuit (40) includes a logic evaluation stage (42), a current steering stage (44), and a current sensor/translator stage (46).

The logic evaluation stage (42) includes inputs $IN_1$, $IN_2$, . . . , $IN_n$, which serve as inputs to transistors $N_1$, $N_2$, . . . , $N_n$ (48, 50, 52) (referred to as "input transistors"), respectively, where n represents the number of inputs to the current steering logic circuit (40). Each input transistor (48, 50, 52) has a terminal connected to an evaluation node, EVAL_NODE, and another terminal connected to low (54), i.e., ground.

Further, wire resistances (53) are shown on EVAL_NODE to indicate that a finite amount of voltage is dissipated on EVAL_NODE. However, those skilled in the art will appreciate that because the current steering logic circuit (40) uses a current mode implementation instead of a voltage mode implementation, wire resistances (53) do not particularly affect the speed of the current steering logic circuit (40). The reason for this is that the speed of the current steering logic circuit (40) does not depend on voltage logic levels being translated from an input of the circuit to its output. Because the speed, and, in turn, the operation of the current steering logic circuit (40) does not particularly depend on the translation of voltage logic levels (which are affected time-wise by resistor-capacitor ("RC") delays in the circuit), the current steering logic circuit (40) operates faster and is amenable to higher fan-in than a circuit using a voltage mode implementation. In short, because only current is sensed on EVAL_NODE, the wire resistances (53) do not really affect the speed of the current steering logic circuit (40).

The current steering stage (44) includes a current source (56) that sources current to EVAL_NODE. EVAL_NODE, in addition to being connected to select terminals of the input transistors (48, 50, 52) in the logic evaluation stage (42), is connected to a terminal of a sink transistor $N_s$ (60), an input of $N_s$ (60), and the current sensor/translator stage (46). $N_s$ (60), in addition to having a terminal connected to EVAL_NODE, has another terminal connected to low (54). Note that in the configuration discussed above for $N_s$ (60), the input of $N_s$ (60) and a terminal of $N_s$ (60) are connected.

The current sensor/translator stage (46) includes circuitry that senses current changes through $N_s$ (60), i.e., mirrors the current flowing through $N_s$ (60), and accordingly outputs logic voltages at an output, OUT, of the current steering logic circuit (40). An embodiment of the current sensor/translator stage (46) is described below with reference to FIG. 4.

When none of the inputs to the current steering logic circuit (40) are high, the input transistors (48, 50, 52) are switched 'off.' Because the input transistors (48, 50, 52) are 'off,' virtually all the current sourced from the current source (56) flows through $N_s$ (60) to ground (54), i.e., the current from the current source (56) is steered through $N_s$ (60).

In this case, because current through $N_s$ (60) is mirrored in the current sensor/translator stage (46), the current sensor/translator stage (46) detects, i.e., senses, that virtually all the current from the current source (56) is being steered through $N_s$ (60) to ground (54), and correspondingly outputs a logic low voltage at OUT. Those skilled in the art will appreciate that for the purposes of the discussion with reference to the embodiment shown in FIG. 3, "logic low" does not necessarily mean zero voltage, i.e., "logic low" may encompass all voltage levels non-inclusively between zero and the voltage level of a power supply for the current steering logic circuit (40).

When one or more of the inputs to the current steering logic circuit (40) goes high, the corresponding input transistors in the logic evaluation stage (42) switch 'on.' Because one or more input transistors are 'on,' a portion of the current sourced by the current source (56) flows through the 'on' input transistors to ground (54), and therefore, a portion of the current sourced by the current source (56) is accordingly steered away from $N_s$ (60), i.e., the current flowing through $N_s$ (60) is reduced. The reduction of current flowing through $N_s$ (60) is sensed, i.e., detected, by the current steering/translator stage (46), which, correspondingly, outputs a logic high voltage at OUT.

Those skilled in the art will appreciate that in other embodiments, the current steering stage (44) may be used in logic circuits that perform different logic operations, e.g., comparator operations, NAND operations, memory array operations, etc. Further, those skilled in the art will appreciate that the current steering logic can also be used in logic circuits having differential gate inputs. Moreover, those skilled in the art will appreciate that in other embodiments, the current source can be designed to be proportional to the leakage currents of input transistors, or other input devices.

Figure 4:
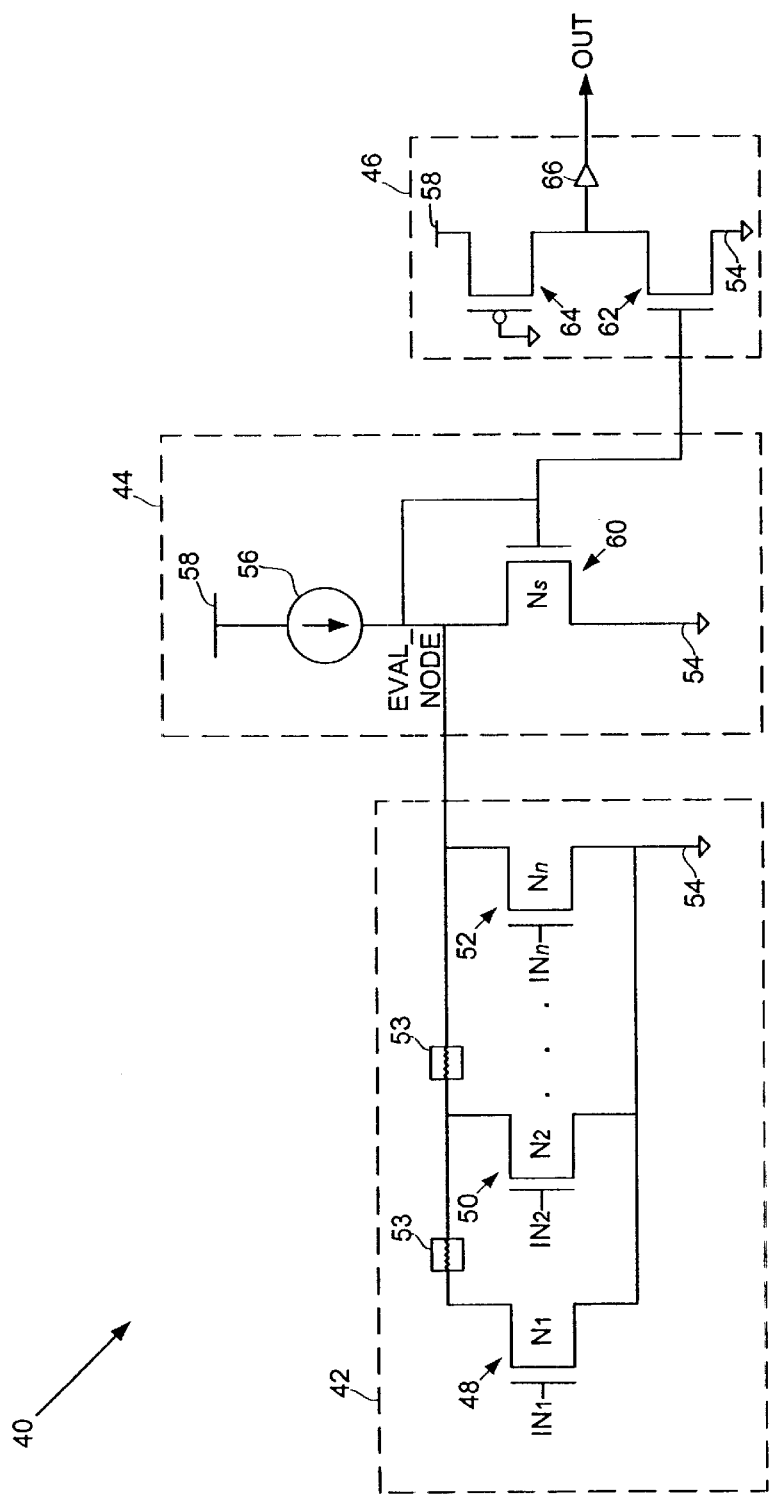
FIG. 4 shows a logic circuit in accordance with another embodiment of the present invention.

Referring to FIG. 4, a current steering logic circuit is shown in accordance with an exemplary embodiment of the present invention. Specifically, FIG. 4 shows an exemplary implementation of the current sensor/translator stage (46), in addition to the logic evaluation stage (42) and current steering stage (44) as described above with reference to FIG. 3.

The current sensor/translator stage (46) includes a NMOS transistor (62) and a PMOS transistor (64) (also referred to as "sensing devices"), and a logic buffer (66). EVAL_NODE serves as an input to the NMOS transistor (62). The NMOS transistor (62) has a terminal connected to low (54) and another terminal connected to both a terminal of the PMOS transistor (64) and the logic buffer (66). The PMOS transistor (64), in addition to having a terminal connected to both a terminal of the NMOS transistor (62) and the logic buffer (66), has another terminal connected to high (58). An input to the PMOS transistor (64) is connected to low (54). Moreover, the logic buffer (66) outputs the output logic voltage, OUT, which also serves as the output of the current steering logic circuit (40). Further, current flowing through $N_s$ (60) is mirrored onto the NMOS transistor (62) and the PMOS transistor (64).

As described above in reference to FIG. 3, when none of the inputs to the current steering logic circuit (40) are high, the input transistors (48, 50, 52) are 'off,' and virtually all the current sourced by the current source (56) flows through $N_s$ (60). Because the current through $N_s$ (60) is mirrored onto the NMOS transistor (62) and the PMOS transistor (64), the input to the logic buffer is or goes low, and therefore, the current steering/translator stage (46) outputs a logic low voltage at OUT.

As described above with reference to FIG. 3, when one or more inputs to the current steering logic circuit (40) are high, the corresponding input transistors are 'on,' and a portion of the current sourced by the current source (56) is steered away from $N_s$ (60). In this case, because one or more input transistors are 'on,' EVAL_NODE goes low because it gets connected to ground (54) through the 'on' input transistors. Because EVAL_NODE goes low, the NMOS transistor (62) becomes less conductive, i.e., switches 'off,' and the input to the logic buffer (66) goes high since it is connected to high through the PMOS transistor (64), which is always 'on.' With the input to the logic buffer (66) now being high, the current steering/translator stage (46) outputs a logic high voltage at OUT. In short, when current is steered away from $N_s$ (60), in the case of one or more input transistors switching 'on,' the current steering/translator stage (46) detects the change in the current flowing through $N_s$ (60), i.e., mirrors the change onto its sensing devices (62, 64), and translates the change to an output voltage.

Those skilled in the art will appreciate that in other embodiments, the current sensor/translator stage (46) may use a current sense amplifier implementation or a differential current sense amplifier implementation.

Advantages of the present invention may include one or more of the following. In one or more embodiments of the present invention, a current source is implemented in a logic circuit to compensate for or overcome leakage currents of devices within the circuit.

In other embodiments, a logic circuit using a current steering scheme may have higher fan-in than a voltage mode circuit because a current source used in the present invention may be designed to overcome leakage currents. This allows for more input devices in a logic circuit, i.e., higher fan-in, because the leakage currents of the input devices do not particularly affect the performance of the logic circuit using the current steering scheme. Further, since leakage currents can be compensated for, faster devices may be used in the circuit without the performance degradation that occurs in circuits that use a voltage mode implementation.

Alternatively, in other embodiments, a current source is designed such that it sources current proportional to leakage currents of devices within a logic circuit.

In one or more embodiments, wire resistances and/or loads do not particularly affect the speed of the current steering logic circuit because the present invention uses a current mode implementation instead of a voltage mode implementation. The reason for this is that the speed of a current mode circuit does not depend on voltage logic levels being translated from an input of the circuit to its output. Because the speed, and, in turn, the operation of the current mode circuit does not particularly depend on the translation of voltage logic levels, the current mode circuit operates faster and is amenable to higher fan-in than a circuit using a voltage mode implementation.

In other embodiments, a logic circuit using a current steering technique operates faster than a logic circuit using a voltage mode implementation. Further, a high fan-in logic circuit using a current steering technique operates significantly faster than a conventional voltage mode circuit.

Alternatively, in other embodiments, a logic circuit using a current steering technique can have higher fan-in because the circuit is not limited by leakage currents of devices within the logic circuit.

In one or more embodiments, a logic circuit using a current steering technique has higher noise immunity because the amount of noise propagated to the output of the logic circuit is decreased.

In other embodiments, a logic circuit using a current steering technique does not have a large keeper device because leakage currents of other devices do not affect the behavior of the logic circuit.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A current steering logic circuit, comprising:
   a logic evaluation stage connected to an evaluation node and having a plurality of inputs, the logic evaluation stage comprising a plurality of input transistors, wherein each input of the plurality of inputs is coupled to only one input transistor of the plurality of input transistors, and the plurality of input transistors are connected in parallel;
   a current steering stage connected to the evaluation node; and
   a current sensor and translator stage connected to the evaluation node.

2. The current steering logic circuit of claim 1, wherein the current steering stage comprises a current source that selectively sources current to the evaluation node and a sink device, and wherein the current from the current source is selectively steered between the logic evaluation stage and the sink device depending upon the plurality of inputs.

3. The current steering logic circuit of claim 2, the current sensor and translator stage comprising:
   at least one sensing device that senses an amount of current flow through the sink device.

4. The current steering logic circuit of claim 3, wherein the current sensor and translator stage translates the sensed amount of current flow to an output voltage.

5. The current steering logic circuit of claim 4, wherein the output voltage is an output of the logic circuit.

6. The current steering logic circuit of claim 1, wherein an amount of current sourced by the current source is proportional to leakage current of the plurality of input transistors.

7. A method for steering current in a current mode logic circuit having a logic evaluation stage connected to an evaluation node, the method comprising:
   inputting a plurality of inputs, wherein each input of the plurality of inputs is coupled to only one input transistor of a plurality of input transistors connected in parallel;
   sourcing current to the evaluation node; and
   selectively steering current between the logic evaluation stage and a sink device depending upon the plurality of inputs.

8. The method of claim 7, wherein the sink device selectively sinks current from a current source depending upon the logic evaluation stage.

9. The method of claim 7, further comprising:
   sensing an amount of current flow through the sink device; and selectively translating the sensed amount of current flow to an output voltage.

10. The method of claim 9, wherein the output voltage is an output of the current mode logic circuit.

11. A method for performing operations in a current mode logic circuit with high fan-in and having a logic evaluation stage, comprising:

inputting a plurality of inputs, wherein each input of the plurality of inputs is coupled to only one input transistor of a plurality of input transistors connected in parallel;

sourcing current to an evaluation node, wherein the evaluation node is connected to the logic evaluation stage;

selectively steering sourced current from the current source to a sink device depending upon the plurality of inputs;

sensing an amount of current flow through a sink device; and selectively translating the sensed amount of current flow through the sink device to an output voltage.

12. The method of claim 11, further comprising:

selectively steering sourced current from the current source to the logic evaluation stage depending upon the plurality of inputs.

13. The method of claim 11, wherein an amount of current sourced by the current source is proportional to leakage currents of the plurality of input transistors.

14. The method of claim 11, wherein at least one sensing device senses the amount of current flow through the sink device.

15. An integrated circuit, comprising:

a logic evaluation stage having a plurality of input transistors connected in parallel, wherein each of the plurality of input transistors has a terminal connected to ground and another terminal connected to an evaluation node, and each input of a plurality of inputs is coupled to only one input transistor of the plurality of input transistors;

a current steering stage having a sink device that sinks current from the evaluation node dependent upon inputs to the plurality of input transistors, wherein the current steering stage has a current source that is used to source current to the evaluation node; and a current translator stage, operatively connected to the evaluation node, that mirrors a current flow through the sink device and generates an output based on the current flow.

\* \* \* \* \*